United States Patent
Aoki

(10) Patent No.: US 8,546,948 B2
(45) Date of Patent: Oct. 1, 2013

(54) SILICON STRUCTURE HAVING BONDING PAD

(75) Inventor: Daigo Aoki, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 10 days.

(21) Appl. No.: 13/353,261

(22) Filed: Jan. 18, 2012

(65) Prior Publication Data
US 2012/0112369 A1    May 10, 2012

Related U.S. Application Data

(63) Continuation of application No. PCT/JP2010/063244, filed on Aug. 5, 2010.

(30) Foreign Application Priority Data

Aug. 18, 2009 (JP) ................. 2009-189041

(51) Int. Cl.
*H01L 23/48* (2006.01)
*H01L 23/52* (2006.01)
(52) U.S. Cl.
USPC ....... 257/773; 257/786; 257/48; 257/E23.024
(58) Field of Classification Search
USPC ............... 257/784, E23.024, 773, 786, 48
See application file for complete search history.

(56) References Cited

U.S. PATENT DOCUMENTS

| | | | | |
|---|---|---|---|---|
| 5,554,940 | A | * | 9/1996 | Hubacher ................ 324/762.03 |
| 5,982,042 | A | | 11/1999 | Nakamura |
| 6,008,542 | A | * | 12/1999 | Takamori ....................... 257/773 |
| 7,105,917 | B2 | * | 9/2006 | Cho et al. ....................... 257/678 |
| 2005/0179114 | A1 | | 8/2005 | Satake |
| 2010/0072603 | A1 | * | 3/2010 | Boon et al. .................... 257/690 |

FOREIGN PATENT DOCUMENTS

| | | |
|---|---|---|
| JP | 7-162259 | 6/1995 |
| JP | 8-29451 | 2/1996 |
| JP | 2005-209858 | 8/2005 |

OTHER PUBLICATIONS

Search Report dated Aug. 31, 2010 from International Application No. PCT/JP2010/063244.

* cited by examiner

*Primary Examiner* — Nitn Parekh
(74) *Attorney, Agent, or Firm* — Beyer Law Group LLP

(57) ABSTRACT

A silicon structure includes a silicon substrate having an electric element; a wiring conductor and a bonding pad, connecting the electric element and an external circuit; a protective layer disposed on the silicon substrate; and a pad opening pattern provided in the protective layer to exposed the bonding pad, wherein a probe mark position and a wire bonding position differ, without increasing the size of the bonding pad in plan view. A substrate exposure part, which is not covered with the protective layer, is provided at part of an outer edge of the bonding pad disposed inside the pad opening pattern in the protective film, and the wiring conductor is not exposed through substrate exposure part.

3 Claims, 5 Drawing Sheets

SILICON STRUCTURE HAVING BONDING PAD

CLAIM OF PRIORITY

This application is a Continuation of International Application No. PCT/JP2010/063244 filed on Aug. 5, 2010, which claims benefit of Japanese Patent Application No. 2009-189041 filed on Aug. 18, 2009. The entire contents of each application noted above are hereby incorporated by reference.

BACKGROUND OF THE INVENTION

1. Field of the Invention

The present invention relates to a silicon structure including a silicon substrate that has an electric element and wiring conductors and bonding pads, which are disposed on the silicon substrate and connect the electric element to an external circuit.

2. Description of the Related Art

In a semiconductor pressure sensor (diaphragm type pressure sensor), which is an example of such a silicon structure, the silicon substrate having a plane rectangular diaphragm (over a cavity) is formed, and a plurality of sensitive resistance elements (electric elements) positioned at the edges of the diaphragm and bonding pads connected to the sensitive resistance elements via wiring conductors are disposed on the silicon substrate. The wiring conductors and the bonding pads are made of a metal thin film, most commonly, an aluminum (Al) film.

In the semiconductor pressure sensor, the sensitive resistance elements and the wiring conductors are covered with a protective film (passivation film), but the bonding pads are exposed for wire-bonding with an external circuit. That is, the protective film has pad opening patterns corresponding to the bonding pads.

SUMMARY OF THE INVENTION

In the past, it was common to form a pad opening pattern with a shape slightly smaller than the outline of a bonding pad. As the size of semiconductor pressure sensors continued to decrease, the following problems have occurred.

All semiconductor pressure sensors are tested at wafer level when they are fabricated. When such a test is performed, the formation of probe mark due to a test probe scrubbing the bonding pad is unpreventable. When the test at on the wafer level is completed, the wafer is diced to separate diaphragm type sensors, and then the bonding pads and external circuits are bonded with gold (Au) wires (connecting wires). If the bonding pad is large (i.e., has a large area), the wire bonding can be performed at a different position from the probe mark (refer to Japanese Unexamined Patent Application Publications Nos. 7-162259 and 8-29451). The size of the bonding pad, however, is currently smaller than a rectangle with 100 μm sides. Thus, the position to be bonded may overlap the probe mark (i.e., wire bonding is performed on the probe mark). In a microscopic view, the metal film may not exist at the probe mark, and thus, if wire bonding is performed on the probe mark, bonding failure (contact failure) may occur. When bonding a Au wire and an Al film, solid-phase diffusion of Au and Al may not occur (the area in which solid-phase diffusion occurs decreases), making it difficult to ensure electrical conductivity. The problems described above are not unique to semiconductor pressure sensors but are also problems of any silicon structure including wiring conductors and bonding pads, which are disposed on a silicon substrate having an electric element and are connected to electric element of an external circuit.

In consideration of the problems described above, the present invention provides a silicon structure in which the position of a probe mark differs from the position of wire bonding, without increasing the size of a bonding pad in plan view.

The present invention provides a solution to the problems by achieving a unique positional relationship and shapes of a bonding pad and a pad opening pattern in a protective layer, which exposes the bonding pad.

The present invention provides a silicon structure including a silicon substrate having an electric element; a wiring conductor and a bonding pad, connecting the electric element and an external circuit; a protective layer disposed on the silicon substrate; and a pad opening pattern provided in the protective layer to exposed the bonding pad, wherein a substrate exposure part, which is not covered with the protective layer, is provided, in plan view, at part of an outer side of the right-angle edge of the bonding pad disposed inside the pad opening pattern in the protective film, and wherein the wiring conductor is not exposed through substrate exposure part.

In the past, it was a general technical knowledge to form a pad opening pattern in a protective film by covering all edges of a bonding pad with the protective film and partially exposing the bonding pad at the center area. In the present invention, a probe contact area is provided by forming the substrate exposure part, which is not covered with the protective layer, at part of an outer edge of the bonding pad disposed inside the pad opening pattern in the protective film; and the substrate exposure part is positioned such that the wiring conductor is not exposed through the pad opening pattern because if the wiring conductor is exposed, the protective film will not function as desired.

According to an aspect, the substrate exposure part may be provided by forming a gap between part of the edge of the bonding pad and part of the edge of the pad opening pattern in the protective film.

The edge of the pad opening pattern forming the gap may be removed when cutting out a silicon structure from a wafer.

In another aspect, the bonding pad is positioned in a right-angle corner of the silicon substrate, which is rectangular in plan view, and has a right-angle edge that is parallel to the right-angle edge of the silicon substrate. In this aspect, the substrate exposure part is provided on the outer side of the right-angle edge of the bonding pad. The wiring conductor is not exposed because it extends in a direction opposite to the substrate exposure part.

An electric device according to another aspect of the present invention includes a silicon structure having a bonding pad connected to an external circuit; it is desirable that a probe mark is provided on the bonding pad near the substrate exposure part and that wire bonding is performed at a position away from the substrate exposure part. That is, a test probe contacts the bonding pad at a position near the substrate exposure part, and a connecting wire is bonded at a position away from the substrate exposure part. Even if the probe contacts both the edge of the bonding pad and the substrate exposure part, a probe mark will not be a problem because the silicon substrate is rigid.

DESCRIPTION OF THE PREFERRED EMBODIMENTS

Figure 1:
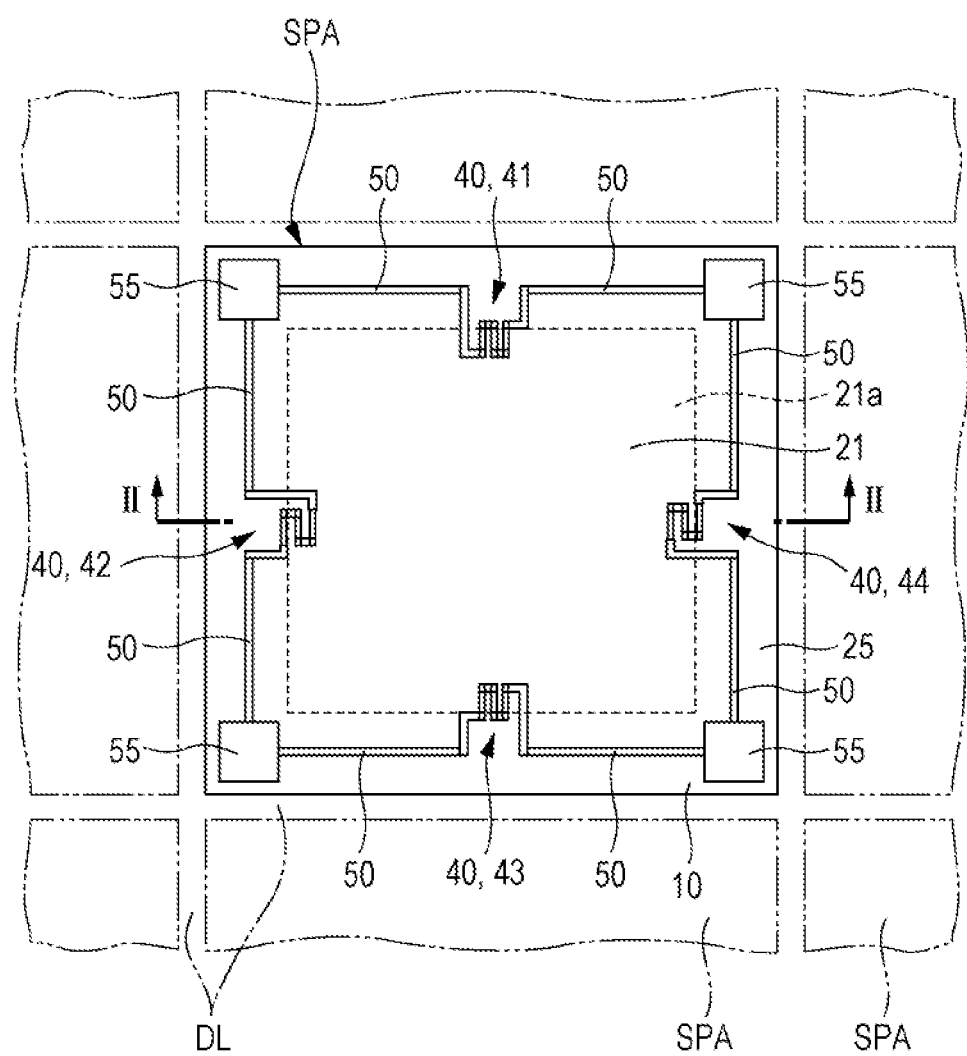
FIG. 1 is a plan view of a silicon structure according to an embodiment of the present invention applied to a semiconductor pressure sensor.
Figure 2:
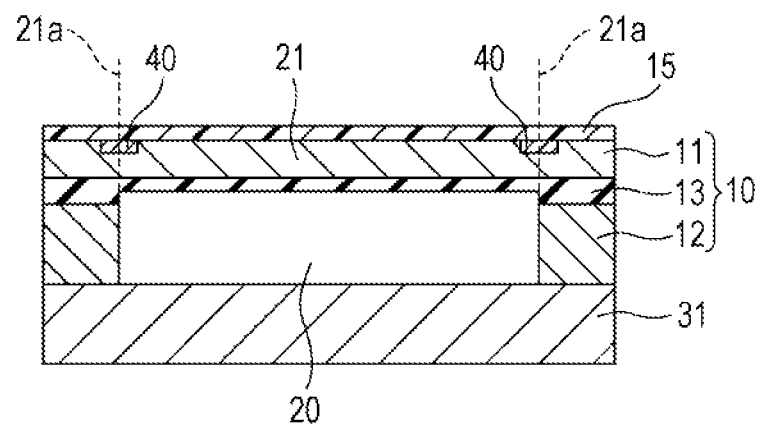
FIG. 2 is a sectional view taken along line II-II in FIG. 1.

FIGS. 1 and 2 illustrate a silicon structure according to an embodiment of present invention applied to a semiconductor pressure sensor SPA and illustrate, in outline, the configuration of the semiconductor pressure sensor SPA. The semiconductor pressure sensor SPA includes a semiconductor substrate 10, which has a pressure detection diaphragm 21 and a cavity 20, and a base substrate 31, which is bonded to a surface of the semiconductor substrate 10 on the cavity 20 side so as to seal the cavity 20 as a vacuum.

The semiconductor substrate 10 is a silicon-on-insulator (SOI) substrate constituted of a first silicon substrate 11 and a second silicon substrate 12 bonded together with a silicon dioxide (SiO2) film 13. The cavity (depression) 20 is formed in the semiconductor substrate 10 by removing part of the second silicon substrate 12 and part of the silicon dioxide film 13 from the side of the second silicon substrate 12. The diaphragm 21 is constituted of the silicon dioxide film 13, which is the upper surface of the cavity 20, and the first silicon substrate 11. The diaphragm 21 in this embodiment is rectangular (square) in plan view, and the outline of the rectangle is indicated in FIG. 1 with dotted lines as diaphragm edge 21a. The diaphragm edge 21a is also the edge of the cavity indicating the outline of the cavity 20. The outer circumference of the diaphragm 21 (diaphragm edge 21a) is a fixed region 25, which is not deformed through pressure changed.

Figure 3:
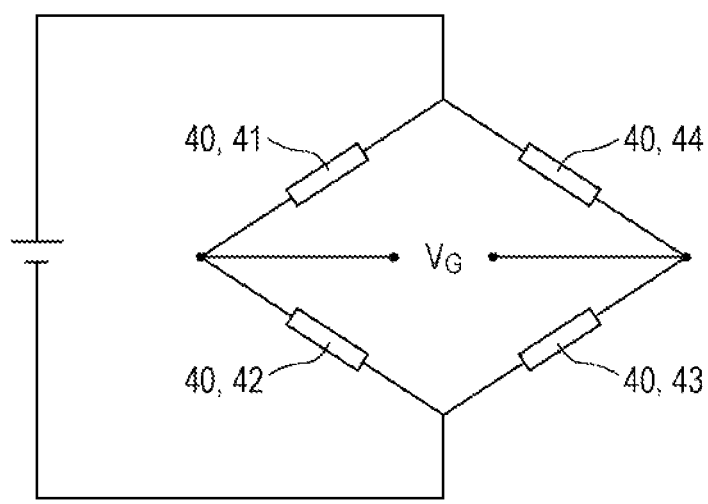
FIG. 3 is a circuit diagram of a bridge circuit.

In the circuit surface (upper surface illustrated in FIG. 1) of the first silicon substrate 11, a plurality of sensitive resistance elements 40 (41 to 44) constituting a bridge circuit 4, which is illustrated in FIG. 3, are embedded. The sensitive resistance elements 40 are disposed on the diaphragm 21 around the center of the diaphragm 21, 90° apart from each other. The surroundings of the sensitive resistance elements 40 are covered with silicon oxide films (not shown). On the silicon oxide film, wiring conductors 50 and bonding pads 55 connect to the sensitive resistance elements 40. The circuit surface is entirely covered with a passivation film (protective film) 15. The passivation film 15 ensures the insulation quality of the sensitive resistance elements 40, the wiring conductors 50, and the first silicon substrate 11. The bonding pads 55 are exposed through the passivation film 15. The passivation film 15 is made of, for example, a monolayer film or a laminated film of silicon nitride (Si3N4) and/or silicon dioxide (SiO2) and, currently, the overall thickness of such a film is approximately 8000 Å. FIG. 1 does not depict the passivation film 15.

When the diaphragm 21 bends in response to pressure applied to the external surface, the resistance values of the sensitive resistance elements 40 change in accordance with the bending. As a result, the midpoint potential VG of the bridge circuit 4 including the sensitive resistance elements 40 changes. FIG. 3 is a circuit diagram of the bridge circuit 4. The midpoint potential VG that changes in response to the change in resistance values of the sensitive resistance elements 40 is output to a known measuring device as a sensor output.

Figure 4:
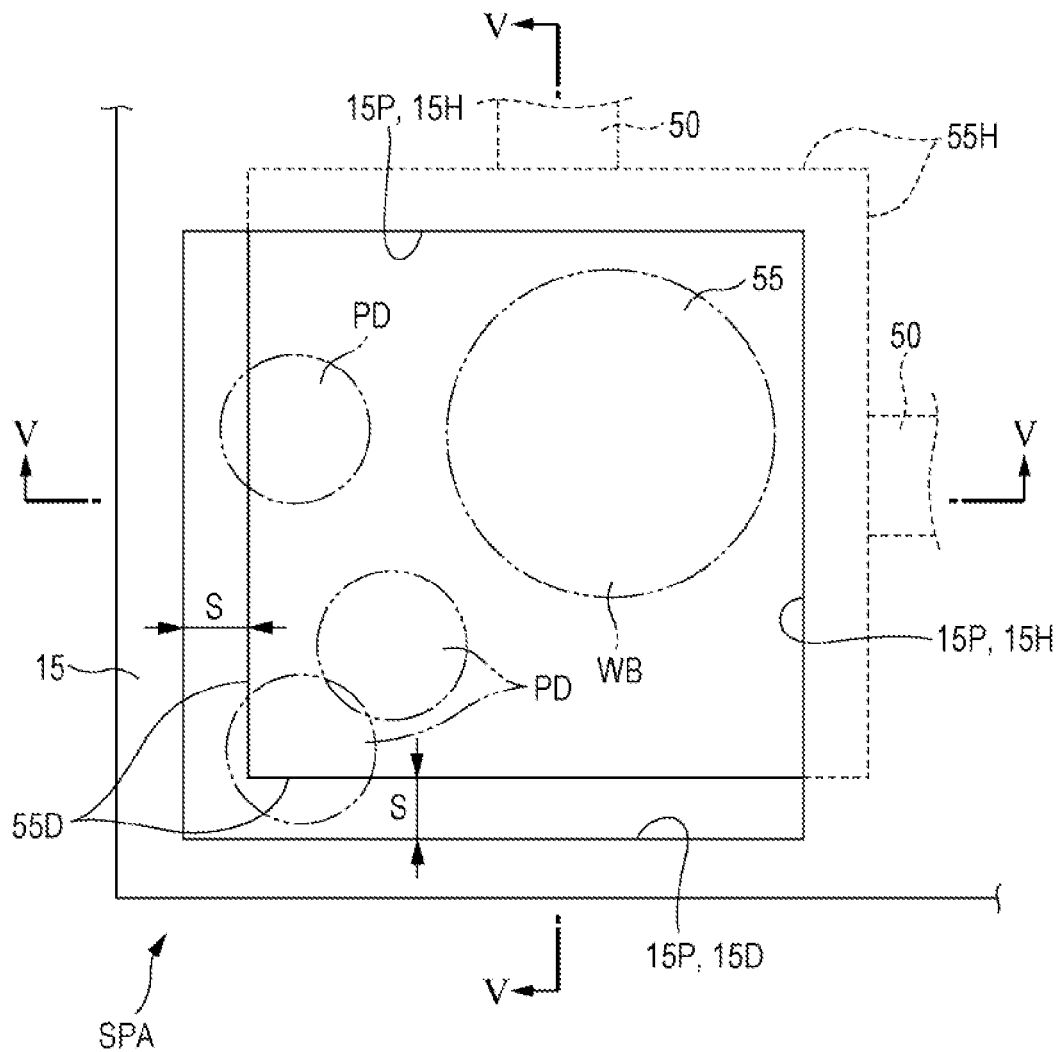
FIG. 4 is an enlarged plan view of a bonding pad of a silicon structure according to an embodiment of the present invention.
Figure 5:
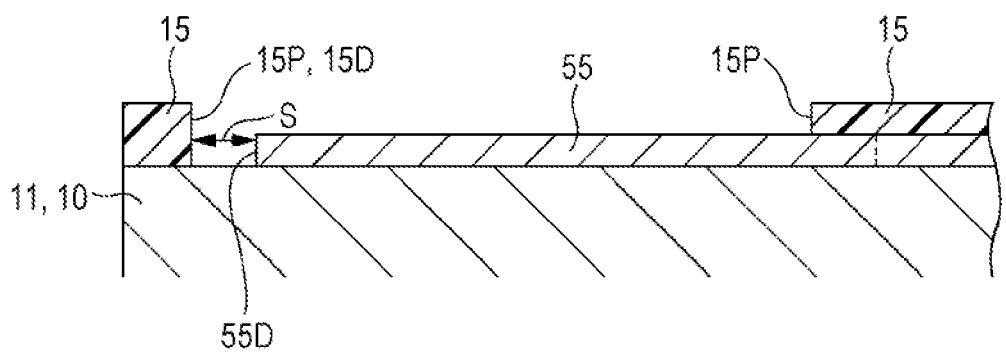
FIG. 5 is a sectional view taken along line V-V in FIG. 4.

As illustrated in FIGS. 4 and 5, the passivation film 15 has pad opening patterns 15P for exposing the bonding pads 55. The bonding pads 55 are all the same shape (or rotationally symmetrical) and are disposed at the four right-angle corners of the semiconductor pressure sensor SPA, which is rectangular in plan view. Each bonding pad 55 has outer right-angle edges 55D along the right-angle edges of the right-angle corner of the semiconductor pressure sensor SPA, and inner edges 55H, which connect to the corresponding wiring conductors 50. Each pad opening pattern 15P in the passivation film 15 includes outer right-angle edges 15D, which are parallel to the corresponding outer right-angle edges 55D such that gaps S are formed between the outer right-angle edges 15D and the outer right-angle edges 55D, and inner edges 15H, which are parallel to the corresponding inner edges 55H and positioned closer to the center of the bonding pad 55 than the inner edges 55H (to cover the edges of bonding pad 55).

The first silicon substrate 11 is exposed through the gaps S, where the passivation film 15 is not disposed. That is, the gaps S function as substrate exposure parts. The substrate exposure parts S are areas where a protective layer (for example, SiO2 film) that entirely covers the first silicon substrate 11 is exposed. The pad opening pattern 15P can be shaped arbitrarily using a known patterning technique (photolithographic technique). Currently, the bonding pads 55 are rectangular with sides of several tens of μm; the inner edges 55H and the inner edges 15H overlap by, for example, approximately 5 μm; the width of the gaps S is, for example, 5 to 10 μam; and the thickness of the bonding pads 55 is approximately 8000 Å.

The substrate exposure parts S, which are not covered with the passivation film 15 and are provided along part of the outer edges of the bonding pad 55 inside each pad opening pattern 15P, facilitate the contacting of a probe to the outer area of the bonding pad 55 (area close to the gaps (substrate exposure parts) S) when each semiconductor pressure sensor SPA among multiple semiconductor pressure sensors SPA that are simultaneously fabricated in a single wafer is tested at the wafer level, which is indicated in FIG. 1 by the chained lines. FIG. 4 depicts example positions of probe marks PD. Even if the probe scrubs the first silicon substrate 11 exposed through the substrate exposure parts S when contacting the bonding pad 55, there is no problem because the first silicon substrate 11 is rigid. That is, it is desirable to contact the outer area of the bonding pad 55, as possible, with a test probe, so long as contact of the test probe and part of the bonding pad 55 is ensured. This can be achieved with this embodiment.

After the test is completed, the semiconductor pressure sensor SPA is removed from the wafer along a dicing line (dicing street) DL (FIG. 1) and is connected to an external circuit, as a product. When connecting the external circuit, the bonding pad 55 and the external circuit are connected by wire bonding (connection wire). Wire bonding is performed on the bonding pad 55 in an area away from the gaps S (away from the probe marks PD). FIG. 4 illustrates an example wire bonding position WB. If the wire bonding position WB is a certain distance away from the probe marks PD (if the probe marks PD and the wire bonding position WB do not overlap), a connecting wire can be bonded to the bonding pad 55, which is not damaged by the probe marks PD and have a sufficient thickness. In particular, if the bonding pad 55 is made of aluminum (Al), sufficient solid-phase diffusion is possible with the gold (Au) connecting wires to establish electrical conductivity. According to this embodiment, the probe marks PD and the wire bonding positions WB can be prevented from overlapping with each other.

Figure 6:
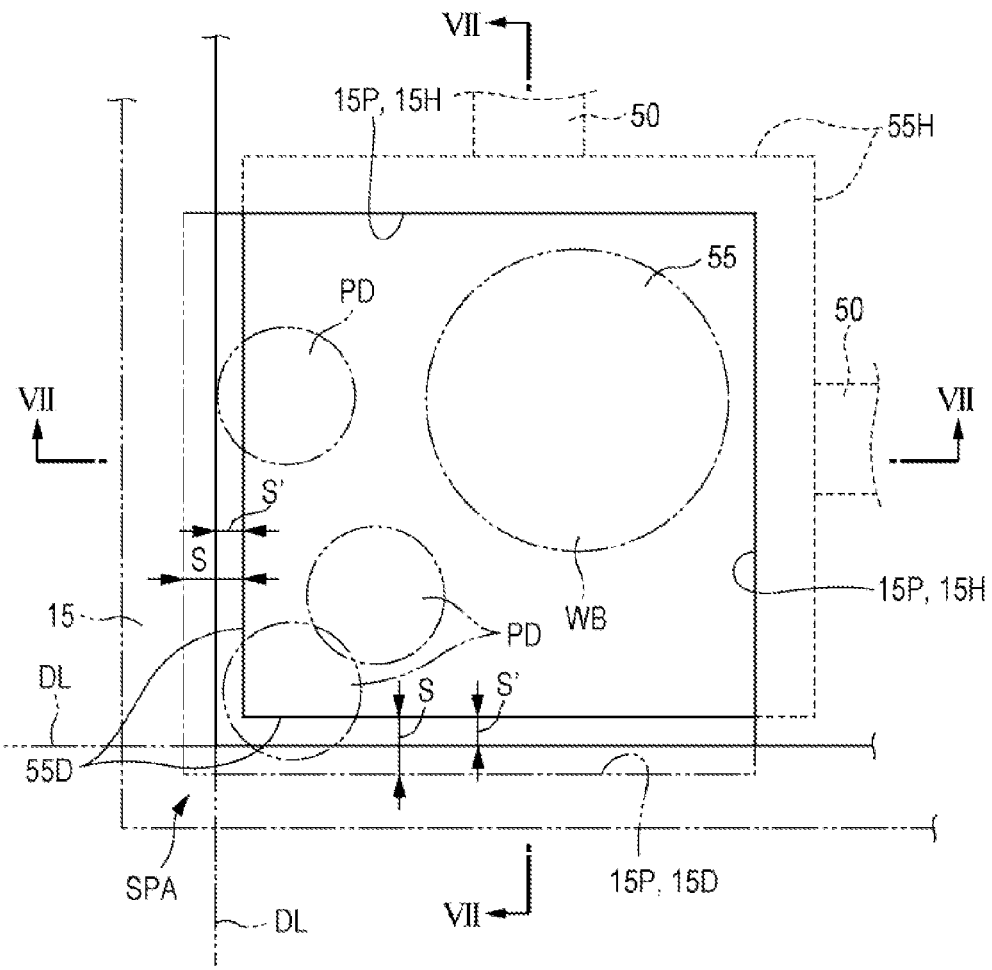
FIG. 6 is an enlarged plan view of a bonding pad of a silicon structure according to another embodiment of the present invention.
Figure 7:
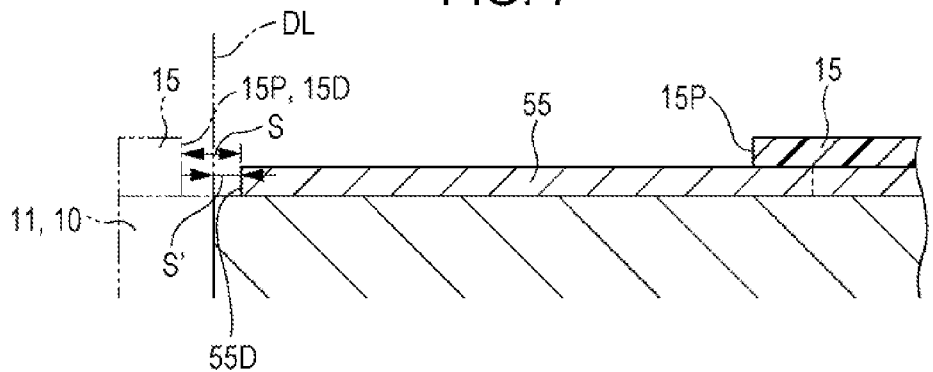
FIG. 7 is a sectional view taken along line VII-VII in FIG. 6.

FIGS. 6 and 7 illustrate a silicon structure having a bonding pad, according to another embodiment of the present invention. According to this embodiment, the dicing line DL, where the semiconductor pressure sensor SPA is cut out of the wafer (FIG. 6), is set in the gaps S and the width of the remaining substrate exposure part S' is small (S≥S'). That is, parts of each pad opening pattern 15P, which are formed at the four corners of the passivation film 15, are cut off parallel to the outer right-angle edge 55D of the bonding pad 55. The advantages achieved in the embodiment illustrated in FIGS. 4 and 5 are also achieved in this embodiment.

Figure 8:
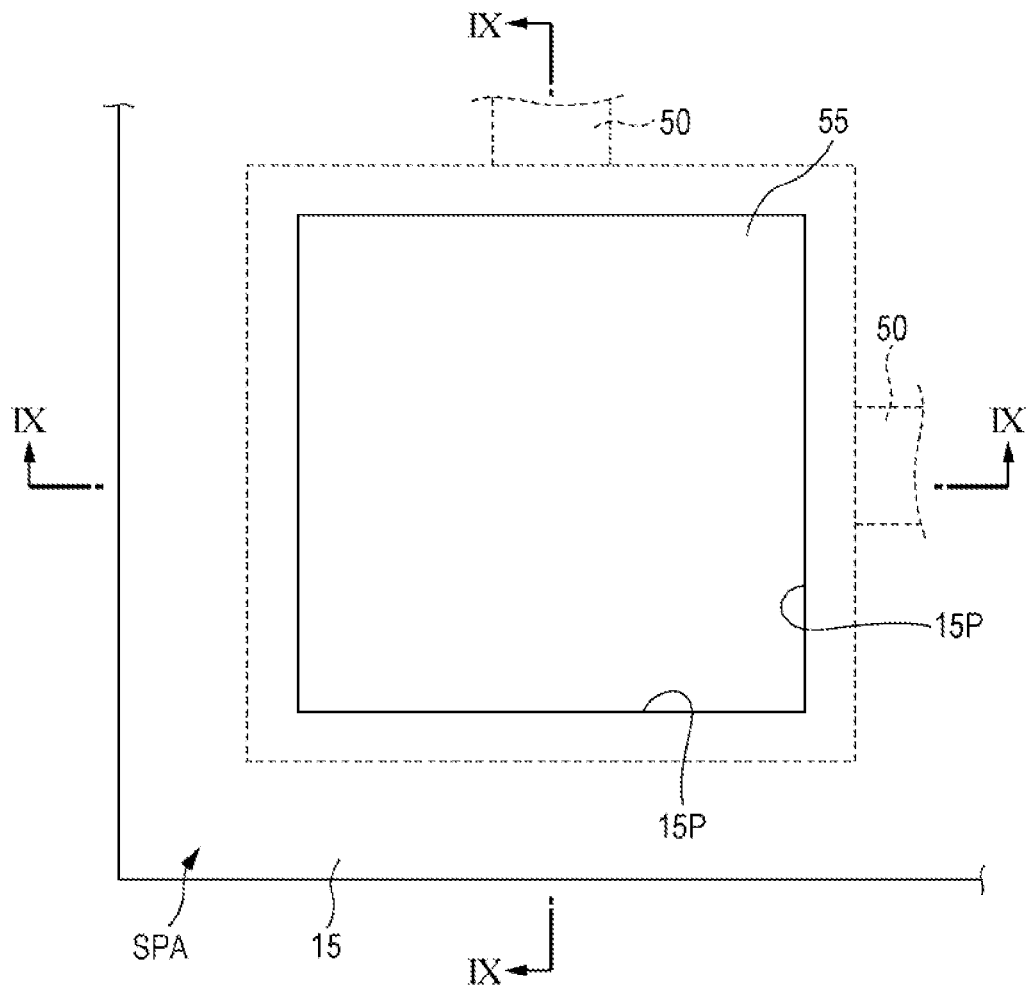
FIG. 8 is an enlarged plan view of a bonding pad of a known silicon structure.
Figure 9:
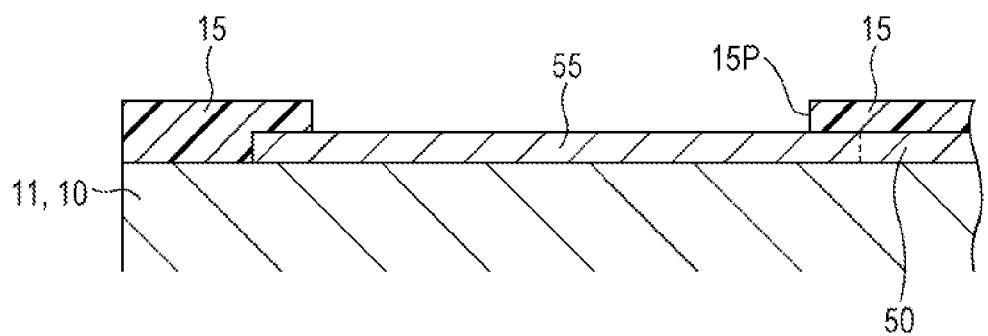
FIG. 9 is a sectional view take along line IX-IX in FIG. 8.

FIGS. 8 and 9 are provided for comparison and illustrate the related art in such a manner that they correspond to FIGS. 4 and 5. The edges of the bonding pad 55 are entirely covered with the passivation film 15. If the size of the bonding pad 55 is the same as that in FIGS. 4 and 5, the exposed area of the bonding pad 55 is small, and it becomes difficult to prevent the probe marks PD and the wire bonding position WB from overlapping each other. If the probe scrubs an edge of the pad opening pattern 15P, the passivation film 15 on the bonding pad 55, which is a metal, will tear, causing defective products. If the size of the semiconductor pressure sensor SPA is continued to be reduced, such problems are even more likely to occur. According to the embodiments, however, the overlapping of the probe marks PD and the wire bonding location WB can be easily prevented. According to the embodiments, even if the probe contacts one of the outer right-angle edges 15D of the pad opening pattern 15P, the passivation film 15 does not break because the passivation film 15 is disposed directly on the first silicon substrate 11, without a bonding pad interposed therebetween. Hence, defective products are less likely to be produced.

The bonding pads 55 according to the embodiments described above are rectangular in plan view. The shape of the bonding pads 55, however, can be set freely. The technical idea of the present invention can be realized by forming a substrate exposure part not covered with a protective film along part of an outer edge of a bonding pad, which is disposed inside a pad opening pattern in a protective film, and by exposing a wiring conductor through this substrate exposure part (gap). The above-described embodiments apply the present invention to a semiconductor pressure sensor. The present invention, however, may be applied to a wide range of silicon structures each including a silicon substrate that has an electric element and a wiring conductor and a bonding pad, which are disposed on the silicon substrate and connect the electric element to an external circuit.

The present invention, however, may be applied to an electric device having a silicon structure including a silicon substrate that has an electric element, and a wire conductor and a bonding pad, which are disposed on the silicon substrate and connect the electric element to an external circuit.

What is claimed is:

1. A silicon structure comprising:
   a silicon substrate having a rectangular area;
   an electric element formed on the silicon substrate in the rectangular area;
   a wiring conductor and a bonding pad formed on the silicon substrate in the rectangular area, the wiring conductor and the bonding pad being configured to connect the electric element to an external circuit, the bonding pad having right-angled outer edges substantially parallel to right-angled edges of the rectangular area;
   a protective layer disposed over on the silicon substrate, the protective layer having a pad opening exposing the bonding pad therethrough,
   wherein the pad opening further exposes a part of the substrate along the right-angled outer edges of the bonding pad to form a substrate exposure portion which is not covered with the protective layer, the pad opening not exposing the wiring conductor,
   wherein the substrate exposure portion is provided as a gap between the right-angled outer edges of the bonding pad and inner edges the protective layer defining a part of the pad opening,
   and wherein a dicing line is provided through the gap such that a portion of the protective layer including the inner edges is removed when the silicon structure is cut out from a wafer.

2. An electric device comprising:
   the silicon structure according to claim 1, wherein:
   the bonding pad of the silicon structure is connected to an external circuit via a connecting wire,
   a probe mark is formed on the bonding pad in a vicinity of the exposed portion of the substrate, and
   the connecting wire is bonded to the bonding pad at a position away from the exposed portion of the silicon substrate.

3. The silicon structure according to claim 1, wherein inner edges of the bonding pad are covered with the protective layer.

* * * * *